(12) United States Patent
Jung et al.

(10) Patent No.: US 8,318,408 B2
(45) Date of Patent: Nov. 27, 2012

(54) METHOD OF FORMING PATTERNS OF SEMICONDUCTOR DEVICE

(75) Inventors: Woo Yung Jung, Seoul (KR); Guee Hwang Sim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 600 days.

(21) Appl. No.: 12/495,184

(22) Filed: Jun. 30, 2009

(65) Prior Publication Data

US 2010/0021849 A1  Jan. 28, 2010

(30) Foreign Application Priority Data

Jul. 28, 2008 (KR) .................. 10-2008-0073478
Mar. 24, 2009 (KR) .................. 10-2009-0024933

(51) Int. Cl.
G03F 7/26 (2006.01)
(52) U.S. Cl. ........................................ 430/311
(58) Field of Classification Search .............. 430/311, 430/322, 330
See application file for complete search history.

(56) References Cited

U.S. PATENT DOCUMENTS

| 2003/0143483 A1* | 7/2003 | Takechi ............... 430/270.1 |
| 2004/0048200 A1* | 3/2004 | Ishibashi .................. 430/311 |
| 2007/0161251 A1* | 7/2007 | Tran et al. ................ 438/725 |
| 2009/0130612 A1* | 5/2009 | Yang ...................... 430/327 |

FOREIGN PATENT DOCUMENTS

| KR | 10-1998-0011721 | 4/1998 |
| KR | 10-2006-0045265 | 5/2006 |
| KR | 10-2007-0051196 | 5/2007 |
| KR | 10-2008-0024053 | 3/2008 |
| KR | 10-2008-0061650 | 7/2008 |

OTHER PUBLICATIONS

Jung et al. (2009) *Proc. of SPIE* 7274:1-9.

* cited by examiner

*Primary Examiner* — Cynthia Kelly
*Assistant Examiner* — Brittany Raymond
(74) *Attorney, Agent, or Firm* — Marshall, Gerstein & Borun LLP

(57) ABSTRACT

In a method of forming patterns of a semiconductor device, a semiconductor substrate defining photoresist patterns formed over a target etch layer is provided. An auxiliary layer is formed over the semiconductor substrate and the photoresist patterns. The auxiliary layer formed on a surface of the photoresist patterns is denatured into first auxiliary patterns. A photoresist film is formed over the semiconductor substrate, the first auxiliary patterns, and the auxiliary layer. The auxiliary layer formed below the photoresist film is denatured into a second auxiliary pattern. Here, the auxiliary layer remains only between the photoresist patterns. Etch mask patterns, including the photoresist patterns and the auxiliary layer, are formed by removing the photoresist film and the first and second auxiliary patterns.

30 Claims, 5 Drawing Sheets

METHOD OF FORMING PATTERNS OF SEMICONDUCTOR DEVICE

CROSS REFERENCES TO RELATED APPLICATIONS

Priority to Korean patent application No. 2008-0073478 filed on Jul. 28, 2008 and to Korean patent application No. 2009-0024933 filed on Mar. 24, 2009, the disclosures of which are incorporated by reference in their entirety, is claimed.

BACKGROUND OF THE DISCLOSURE

1. Field of the Disclosure

The disclosure generally relates to a method of forming patterns of a semiconductor device and, more particularly, to a method of forming micro patterns of a semiconductor device.

2. Brief Description of Related Technology

A number of elements, such as gates or isolation layers, are formed in a semiconductor substrate. Metal wiring lines are also formed in order to electrically connect the gates. The metal wiring lines and a junction (for example, the source or drain of a transistor) of the semiconductor substrate are electrically connected by a contact plug.

The gates, the metal wiring lines, etc. are generally formed by a pattern formation process. That is, a target etch layer (for example, a gate stack layer, a conductive layer or an insulating layer) whose pattern will be formed on the semiconductor substrate is formed. An etch mask pattern is formed on the target etch layer. The target etch layer is patterned by an etch process employing an etch mask pattern. A micro pattern is formed using the pattern formation process. Heretofore, that process was considered an indispensable process of forming semiconductor devices with an ultra-small size and high performance. However, the size of a pattern that can be formed is limited due to the limitations of equipment used in the pattern formation process, and the difficulties in overcoming those limitations.

SUMMARY OF THE INVENTION

Disclosed herein is a method of forming micro patterns of a semiconductor device.

One embodiment of the method includes providing a semiconductor substrate defining photoresist patterns formed over a target etch layer, forming an auxiliary layer over the semiconductor substrate and the photoresist patterns, denaturing the auxiliary layer into first auxiliary patterns, forming a photoresist film over the semiconductor substrate, the first auxiliary patterns, and the auxiliary layer, denaturing the auxiliary layer into a second auxiliary pattern, the auxiliary layer remaining only between the photoresist patterns, and removing the photoresist film and the first and second auxiliary patterns to form etch mask patterns comprising the photoresist patterns and the auxiliary layer.

Another embodiment of the method includes providing a semiconductor substrate having first and second regions defining patterns. The patterns are formed to have a pitch or each has a width wider in the second region than in the first region. The method also includes forming a target etch layer and photoresist patterns over the semiconductor substrate, forming an auxiliary layer over the semiconductor substrate and the photoresist patterns thereon, denaturing the auxiliary layer into first auxiliary patterns, forming a photoresist film over the semiconductor substrate, the first auxiliary patterns, and the auxiliary layer, and denaturing the auxiliary layer into a second auxiliary pattern, the auxiliary layer remaining only between the photoresist patterns. The method also includes removing the photoresist film and the first and second auxiliary patterns to form etch mask patterns that include the photoresist patterns and the auxiliary layer.

The photoresist patterns can include fat-soluble materials, and the auxiliary layer can include water-soluble materials.

The method can further include, after forming the auxiliary layer, performing a baking process at a temperature higher than a glass transition temperature of the photoresist patterns and the auxiliary layer.

The first and second auxiliary patterns can be removed simultaneously with the photoresist film.

The first and second auxiliary patterns can be removed simultaneously with a development process for the photoresist film.

The first and second auxiliary patterns can be formed by diffusing hydrogen ions ($H^+$) into the auxiliary layer.

The first auxiliary patterns can be formed by an annealing process.

Preferably a gap between the photoresist patterns is three times greater than a width of each of the photoresist patterns.

Preferably a gap between the photoresist patterns formed in the first region is three times greater than a width of each of the photoresist patterns formed in the first region.

A thickness of the first auxiliary patterns preferably is identical to that of the photoresist patterns.

The second auxiliary pattern preferably is formed by performing an exposure process on the photoresist film.

When an exposure process to form the second auxiliary pattern is performed on the photoresist film, amounts of light irradiated on the first and second regions are set differently.

The amount of light irradiated on the first region can be smaller than the amount of light irradiated on the second region.

The height of the auxiliary layer remaining in the first region preferably diminishes with an increasing amount of light irradiated on the first region.

The second auxiliary pattern can be formed in an entire region other than a boundary between the second region and the first region.

When the exposure process is performed on the photoresist film, the photoresist film between the first and second regions is not subject to the exposure process.

According to another embodiment of the method includes forming photoresist patterns over a semiconductor substrate, forming an auxiliary layer on the photoresist patterns, and annealing the semiconductor substrate to denature the auxiliary layer so that the auxiliary layer can be removed when performing a development process for a photoresist film. The method also includes forming the photoresist film on the auxiliary layer, exposing the photoresist film to denature the auxiliary layer formed below the photoresist film so that the auxiliary layer can be removed when performing the development process for the photoresist film, wherein the non-denatured auxiliary layer remains between the photoresist patterns, and performing a development process to remove the exposed photoresist film and the denatured auxiliary layer, leaving the photoresist patterns and the non-denatured auxiliary layer.

The auxiliary layer can be denatured in such a manner that acid is diffused from the photoresist patterns or the photoresist film and the auxiliary layer can be removed when the development process for the photoresist film is performed.

The auxiliary layer can be denatured in such a manner that hydrogen ions ($H^+$) are diffused from the photoresist patterns or the photoresist film and the auxiliary layer can be removed when the development process for the photoresist film is performed.

The photoresist patterns can include fat-soluble materials, and the auxiliary layer can include water-soluble materials.

The method can also include, after forming the auxiliary layer, performing a baking process at a temperature higher than a glass transition temperature of the photoresist patterns and the auxiliary layer.

Yet another embodiment of the method includes providing a semiconductor substrate defining etch auxiliary patterns formed over a target etch layer, forming an auxiliary layer over the semiconductor substrate and the etch auxiliary patterns, and denaturing the auxiliary layer into first auxiliary patterns and denaturing a top surface of the auxiliary layer into a second auxiliary pattern so that the auxiliary layer remains only between the etch auxiliary patterns. The method also includes removing the first and second auxiliary patterns to form etch mask patterns that include the etch auxiliary patterns and the remaining auxiliary layer.

In another embodiment, the method includes forming a target etch layer and etch auxiliary patterns over a semiconductor substrate defining first and second regions, the etch auxiliary patterns having a pitch or each has a width greater in the second region than in the first region. The method also includes forming an auxiliary layer over the semiconductor substrate and the etch auxiliary patterns, denaturing the auxiliary layer into first auxiliary patterns, and denaturing a top surface of the auxiliary layer into a second auxiliary pattern so that the auxiliary layer remains only between the etch auxiliary patterns. The method also includes removing the first and second auxiliary patterns to form etch mask patterns that include the etch auxiliary patterns and the remaining auxiliary layer.

The forming of the second auxiliary pattern can include forming a material film that is the same as the etch auxiliary patterns, and forming into the second auxiliary pattern the auxiliary layer that contacts the material film.

The first and second auxiliary patterns can be formed in such a manner that hydrogen ions ($H^+$) are diffused from the etch auxiliary patterns or the material film.

The etch auxiliary patterns can include fat-soluble materials, and the auxiliary layer can include water-soluble materials.

The method can also include, after forming the auxiliary layer, performing a baking process at a temperature higher than a glass transition temperature of the etch auxiliary patterns and the auxiliary layer.

Additional features of the invention may become apparent to those skilled in the art from a review of the following detailed description, taken in conjunction with the drawings, the examples, and the appended claims.

BRIEF DESCRIPTION OF THE DRAWINGS

For a more complete understanding of the disclosure, reference should be made to the following detailed description and accompanying drawing wherein.

Figure 1A:
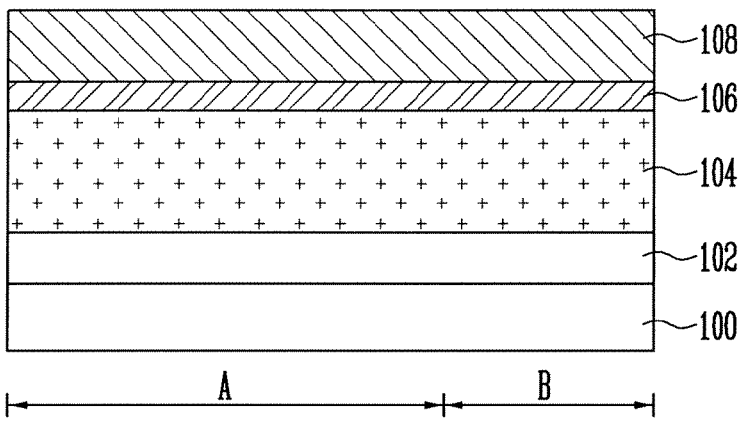
FIGS. 1A to 1I are sectional views illustrating a method of forming patterns of a semiconductor device according to an embodiment; and, FIG. 2 is a scanning electron microscope (SEM) photograph showing that a development process was performed on a developer-soluble BARC (DBARC) film and a photoresist film at the same time.

While the disclosed method is susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein

DETAILED DESCRIPTION

Hereinafter, an embodiment of this disclosure will be described in detail with reference to the accompanying drawings. The present embodiment is provided to complete the disclosure and to allow those having ordinary skill in the art to understand the scope of this disclosure. When it is said that any part, such as a layer, film, region, or plate, is positioned on another part, it means the part is directly on the other part or above the other part with at least one intermediate part. To clarify multiple layers and regions, the thickness of the layers is enlarged in the drawings.

FIGS. 1A to 1I are sectional views illustrating a method of forming patterns of a semiconductor device according to an embodiment.

Referring to FIG. 1A, there is provided a semiconductor substrate 100 including a first region A and a second region B. The first region A is a region in which patterns denser than that of the second region B are formed. The width or pitch of a pattern formed in the second region B is greater than that formed in the first region A. For example, the first region A can be a cell region of a NAND flash memory device, and the second region B can be a peri region of the NAND flash memory device. A region between the first region A and the second region B can be a region in which a pad of the NAND flash memory device will be formed.

A target etch layer 102 is formed over the semiconductor substrate 100. The target etch layer 102 is a layer on which patterns will be formed, and can include an insulating layer for forming a contact hole, a gate stack layer for forming a gate, and so on.

A hard mask layer 104, an anti-reflective layer 106, and a first photoresist film 108 are formed over the target etch layer 102 in order to pattern the target etch layer 102. The anti-reflective layer 106 can increase the resolution of an exposure process by reducing exposure light reflected from a bottom of a photoresist film 108 at the time of an exposure process on the photoresist film 108.

Meanwhile, the hard mask layer 104 and the anti-reflective layer 106 are formed of a fluidable film like the first photoresist film 108 such that the hard mask layer 104, the anti-reflective layer 106, and the first photoresist film 108 can be formed consecutively within the same process apparatus. To this end, the hard mask layer 104 can be formed of spin on carbon (SOC) materials, and the anti-reflective layer 106 can be formed of Si-containing bottom anti-reflective coating (BARC) materials.

Figure 1B:
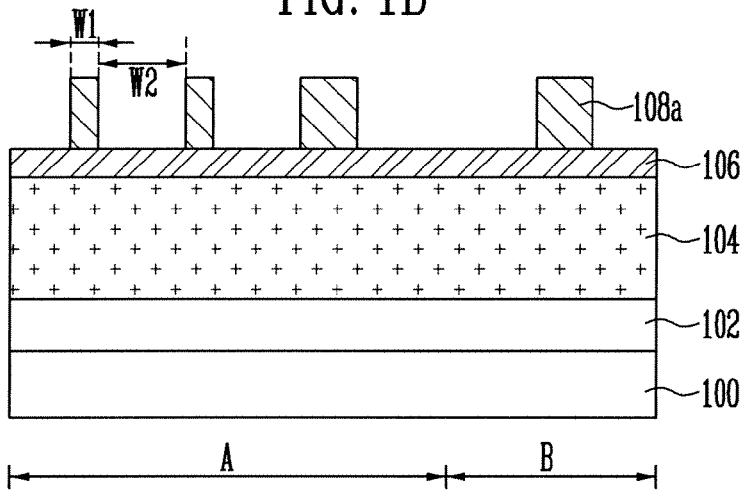

Referring to FIG. 1B, auxiliary etch patterns, i.e., first photoresist patterns 108a are formed by performing exposure and development processes on the first photoresist film 108 (refer to FIG. 1A).

Here, the pitch of the first photoresist patterns 108a or the width of the each photoresist pattern 108a formed on the first region A of the semiconductor substrate 100 on which dense patterns are formed can be formed to a minimum size that can be implemented through exposure and development processes. A width W1 of the first photoresist pattern 108a formed in the first region A and a pitch thereof are similar to those of patterns to be formed in the target etch layer 102. A distance W2 between the first photoresist patterns 108a formed in the first region A can be about three times the width W1 of the first photoresist pattern 108a. Meanwhile, a width of the first photoresist pattern 108a formed in the first region A adjacent to the second region B is greater than that of the other first photoresist patterns 108a formed in the first region A, so that problems, such as a dishing phenomenon caused by a difference in the pattern density with the second region B, can be minimized.

A width of the first photoresist pattern 108a formed on the second region B of the semiconductor substrate 100 and a pitch thereof can be greater than those of the first photoresist patterns 108a formed on the first region A of the semiconductor substrate 100. It may be preferred that a width of the first photoresist pattern 108a formed on the second region B of the semiconductor substrate 100 and a pitch thereof be similar to those of an etch mask pattern formed to pattern the target etch layer 102 of the second region B of the semiconductor substrate 100.

The first photoresist patterns 108a may be dissolved by an auxiliary layer coated in a subsequent process. In order to prevent the first photoresist patterns 108a from being dissolved by the auxiliary layer, after the first photoresist patterns 108a are formed, a process of sintering the first photoresist patterns 108a is carried out. The process of sintering the first photoresist patterns 108a may be performed using an annealing process. When the first photoresist patterns 108a are subject to the annealing process, the first photoresist patterns 108a are cross-linked and sintered. Meanwhile, a thermal acid generator (TAG) included in the first photoresist patterns 108a may be activated through the annealing process.

Furthermore, in order to further facilitate the cross-linking or TAG activation of the first photoresist patterns 108a, a cross linker or TAG may be added to the first photoresist film 108 (refer to FIG. 1A) when the first photoresist film 108 (refer to FIG. 1A) is formed.

Furthermore, in order to prevent the first photoresist patterns 108a from being dissolved by the auxiliary layer, when the first photoresist film 108 (refer to FIG. 1A) is formed, the first photoresist film 108 may be made of materials having a different property from that of the auxiliary layer. For example, when the auxiliary layer formed in a subsequent process is water-soluble, the first photoresist film 108 (refer to FIG. 1A) may be made of fat-soluble materials so that the first photoresist patterns 108a can be prevented from being dissolved by the auxiliary layer coated in a subsequent process.

Figure 1C:
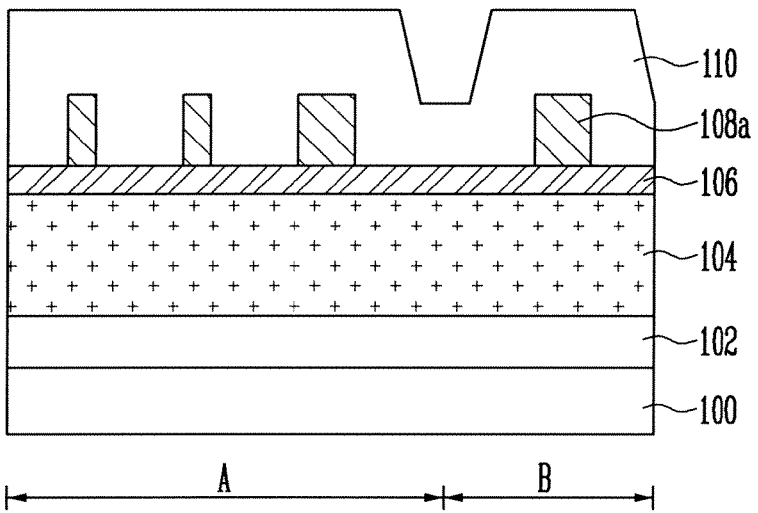

Referring to FIG. 1C, an auxiliary layer 110 is formed on the anti-reflective layer 106 including the first photoresist patterns 108a. The auxiliary layer 110 is formed to a thickness sufficient to fully fill the spaces between the first photoresist patterns 108a formed in the first region A and also cover the first photoresist patterns 108a. Meanwhile, a gap between the first photoresist patterns 108a formed in the second region B is wider than a gap between the first photoresist patterns 108a formed in the first region A. Accordingly, the auxiliary layer 110 formed in the second region B may be formed along the steps of the first photoresist patterns 108a because it does not fill the spaces between the first photoresist patterns 108a formed in the second region B.

The auxiliary layer 110 functions as an anti-reflective layer and can be removed together with a subsequent photoresist film through a development process when acid, such as hydrogen ions (H$^+$), is supplied. That is, the auxiliary layer 110 can be formed of developer-soluble BARC materials that are used in the development process for a photoresist film.

Figure 2:
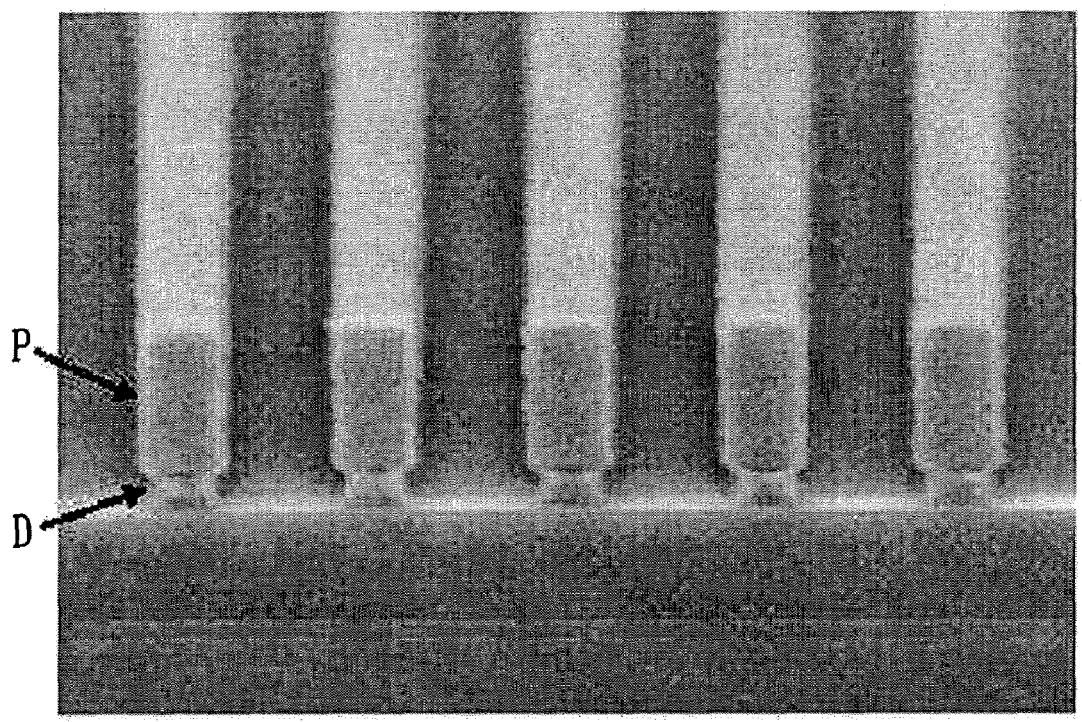

FIG. 2 is a scanning electron microscope (SEM) photograph showing that a development process was performed on a developer-soluble BARC (DBARC) film and a photoresist film at the same time.

Referring to FIG. 2, in the case in which, after the photoresist film is formed on the developer-soluble BARC (DBARC) film ("D"), photoresist patterns ("P") are formed by performing exposure and development processes on the photoresist film, although an additional etch process is not performed on the DBARC film D, the DBARC film D is also etched and patterned when the development process is performed on the photoresist patterns P. This is because acid, such as H$^+$ ions included in the photoresist patterns P, is diffused into the DBARC film D coming into contact with the photoresist film through the exposure process, and the DBARC film D of the region into which the acid has been diffused is changed to a state that the DBARC film D can be developed and removed when the development process is performed on the photoresist film.

Referring to FIG. 1C, the auxiliary layer 110 formed of the DBARC film having the characteristic described above with reference to FIG. 2 is preferably made of water-soluble materials unlike the first photoresist patterns 108a that are soluble in fats. Alternatively, when the first photoresist patterns 108a are water-soluble, the auxiliary layer 110 can be made of fat-soluble materials. If, as described above, the auxiliary layer 110 is made of materials having a different property from that of the first photoresist patterns 108a, although the auxiliary layer 110 being in a fluid state is formed on the first photoresist patterns 108a, a problem that the first photoresist patterns 108a are dissolved is not generated.

After the auxiliary layer 110 is formed, a baking process for improving the surface roughness of the first photoresist patterns 108a can be further performed. In order to improve the surface roughness of the first photoresist patterns 108a, the baking process has to be performed at a glass transition temperature (Tg) or more of the first photoresist patterns 108a and the auxiliary layer 110. Since the first photoresist patterns 108a and the auxiliary layer 110 have different properties (i.e., water-soluble and fat-soluble), the surface energy between the first photoresist patterns 108a and the auxiliary layer 110 is high. Accordingly, if the baking process is performed at the glass transition temperature or more, the molecules of the first photoresist patterns 108a are moved in such a way as to minimize the surface energy between the first photoresist patterns 108a and the auxiliary layer 110. Consequently, the surface roughness of the first photoresist patterns 108a can be improved.

Figure 1D:
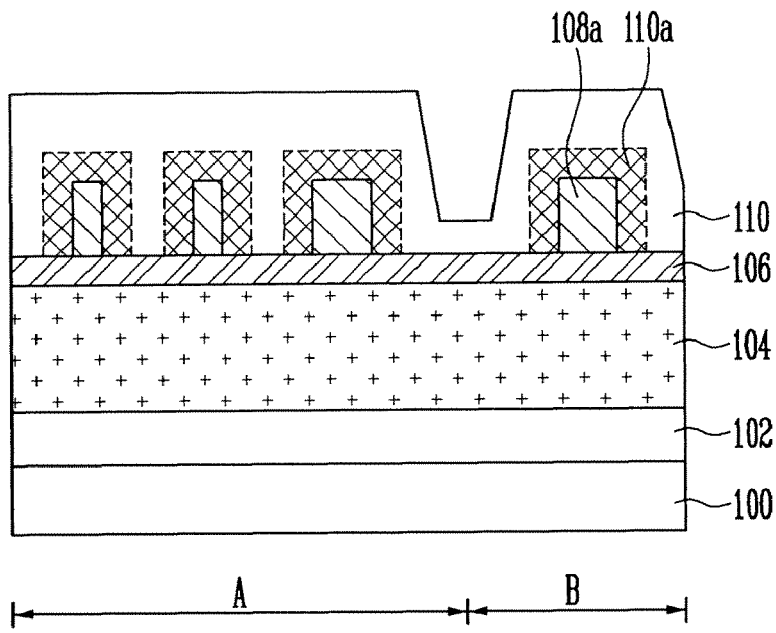

Referring to FIG. 1D, a first auxiliary pattern 110a is formed at the interface between each of the first photoresist patterns 108a and the auxiliary layer 110. In order to form the first auxiliary patterns 110a, acid, such as H$^+$ ions included in the first photoresist patterns 108a, has to be diffused into the auxiliary layer 110 coming into contact with the first photoresist patterns 108a. The diffusion of the acid included in the first photoresist patterns 108a can be performed through an annealing process. If the acid, such as H$^+$ ions, is diffused into the auxiliary layer 110 as described above, the auxiliary layer 110 of the portions into which the acid has been diffused is denatured to the first auxiliary patterns 110a which is in a state that they can be dissolved by a developer. The first auxiliary patterns 110a are formed on the surface of the first photoresist patterns 108a because they are formed through the acid diffused from the first photoresist patterns 108a.

The thickness of the first auxiliary patterns 110a preferably is similar to that of the first photoresist patterns 108a. Since the thickness of the first auxiliary patterns 110a is increased with a higher temperature or a longer turn-around time of an annealing process, the thickness of the first auxiliary patterns 110a can be controlled by adjusting the temperature or the turn-around time of the annealing process.

Next, a process of forming a second auxiliary pattern on the auxiliary layer 110 is performed such that the auxiliary layer 110 remains only between the first photoresist patterns 108a. This is described below with reference to the accompanying drawings.

Figure 1E:
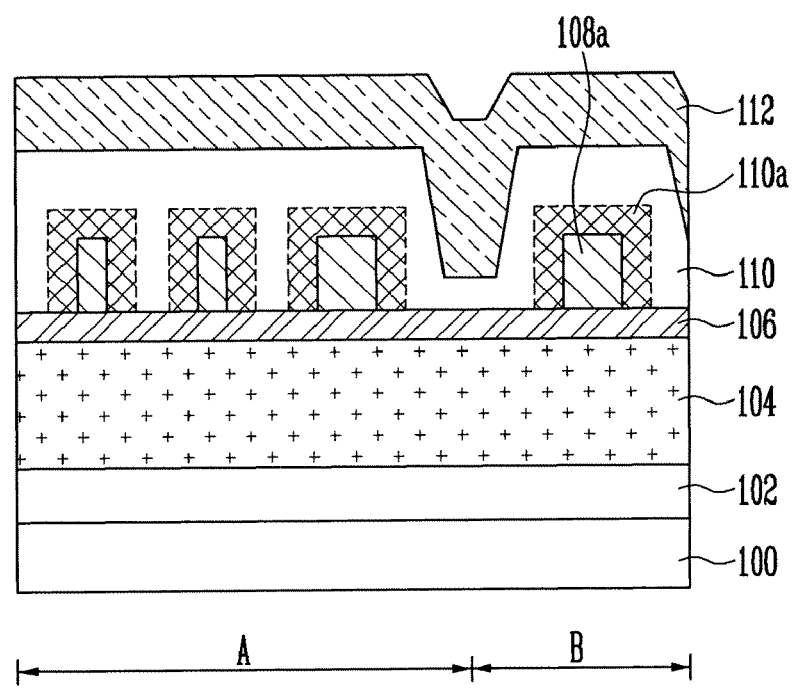

Referring to FIG. 1E, a second photoresist film 112 is formed on the auxiliary layer 110. The surface of the second photoresist film 112 formed in the second region B can be formed along the step of the underlying auxiliary layer 110. The second photoresist film 112 includes a photo acid generator (PAG) and reacts to light, thereby being capable of generating acid such as H+ ions.

Figure 1F:
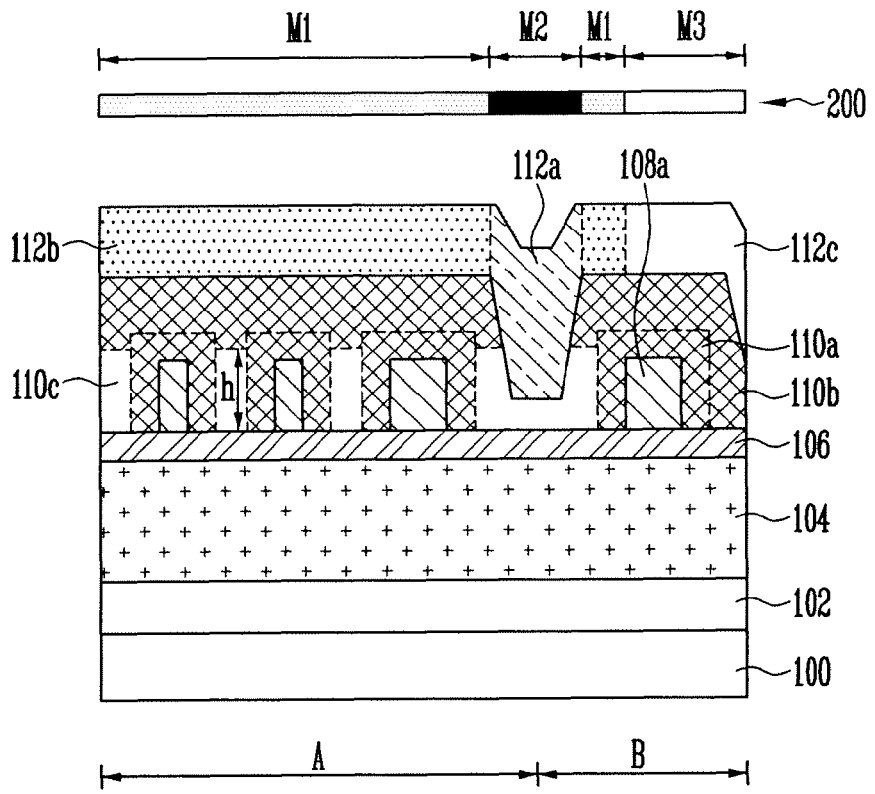

Referring to FIG. 1F, a second auxiliary pattern 110b is formed at the interface between the second photoresist film 112 (refer to FIG. 1E) and the auxiliary layer 110 (refer to FIG. 1E). In order to form the second auxiliary pattern 110b, acid, such as H+ ions, has to be diffused into the auxiliary layer 110 (refer to FIG. 1E) coming into contact with the second photoresist film 112 (refer to FIG. 1E). The diffusion of the acid included in the second photoresist film 112 (refer to FIG. 1E) can be performed through an exposure process using a reticle 200.

After the second auxiliary pattern 112 is formed, some of the auxiliary layer 110 remain only between the first auxiliary patterns 110a, thereby defining third auxiliary patterns 110c separated from each other. Accordingly, each of the third auxiliary patterns 110c separated from the first photoresist patterns 108a can be formed between the first photoresist patterns 108a formed in the first region A at limited intervals depending on the limit of exposure resolution. The third auxiliary patterns 110c, together with the first photoresist patterns 108a, are used as etch barriers in a subsequent process.

Meanwhile, the third auxiliary patterns 110c preferably are formed in the first region A in which dense patterns have to be formed as compared with the second region B. Furthermore, the third auxiliary patterns 110c preferably are not formed in a portion of the second region B, wherein patterns have to be formed at wide intervals as compared with the first region A. In addition, each of the third auxiliary patterns 110c having a step shape can be formed between the first photoresist patterns 108a formed at wide intervals as compared with the first photoresist patterns 108a formed in the first region A. In order to form the third auxiliary patterns 110c in various regions as described above, the diffusion of the acid, such as H+ ions, has to be controlled when the second auxiliary pattern 110b is formed.

In order to control the diffusion of the acid when the second auxiliary pattern 110b is formed, the reticle 200 having a varying transmittance every region is used. This reticle 200 may include a halftone phase shift mask. The reticle 200, such as a halftone phase shift mask, includes a first transmission unit M1 that transmits light of more than 0% to less than 100%, a second transmission unit M3 that transmits light of 100%, and a light-shielding unit M2 that shields light.

If the second photoresist film 112 is subject to an exposure process using the reticle 200 including the first and second transmission units M1 and M3 and the light-shielding unit M2, the second photoresist film 112 is divided into a non-exposure region 112a corresponding to the light-shielding unit M2, a first exposure region 112b corresponding to the first transmission unit M1, and a second exposure region 112c corresponding to the second transmission unit M3.

The amount of H+ ions generated within the second exposure region 112c is greater than that generated within the first exposure region 112b because a large amount of light as compared with the first exposure region 112b is incident on the second exposure region 112c. Thus, the amount of H+ ions diffused into the auxiliary layer 110 (refer to FIG. 1E) coming into contact with the second exposure region 112c is greater than the amount of H+ ions diffused into the auxiliary layer 110 (refer to FIG. 1E) coming into contact with the first exposure region 112b. Consequently, the third auxiliary patterns 110c can be formed under the first exposure region 112b although the third auxiliary patterns 110c are not formed because the auxiliary layer 110 (refer to FIG. 1E) does not remain under the second exposure region 112c. The first exposure region 112b has to have the third auxiliary patterns 110c formed thereunder, and preferably to be formed in a region in which the thickness of the auxiliary layer 110 (refer to FIG. 1E) is thicker than that of the first photoresist patterns 108a. Furthermore, the second exposure region 112c preferably is formed in a region in which the third auxiliary patterns 110c should not be formed.

Furthermore, H+ ions are not generated in the non-exposure region 112a corresponding to the light-shielding unit M2. Accordingly, since H+ ions are not diffused into the auxiliary layer 110 (refer to FIG. 1E) coming into contact with the non-exposure region 112a, the second auxiliary pattern 110b is not formed under the non-exposure region 112a. Consequently, the auxiliary layer 110 (refer to FIG. 1E) remains under the non-exposure region 112a, and so the third auxiliary patterns 110c are formed. The non-exposure region 112a has to have the third auxiliary patterns 110c formed thereunder, and preferably to be formed in a region in which the thickness of the auxiliary layer 110 (refer to FIG. 1E) is thinner than that of the first photoresist patterns 108a.

Meanwhile, in order to control the height 'h' of the third auxiliary patterns 110c formed under the first exposure region 112b, light transmittance of the first transmission unit M1 corresponding to the first exposure region 112b can be controlled. That is, as the transmittance of light increases, the height 'h' of the third auxiliary patterns 110c diminishes. As the transmittance of light decreases, the height 'h' of the third auxiliary patterns 110c increases. In this disclosure, the height 'h' of the third auxiliary patterns 110c preferably is formed to be lower than the height of the first auxiliary patterns 110a such that the third auxiliary patterns 110c are separated from each other. To this end, the transmittance of the first transmission unit M1 preferably is controlled to have 6% to 8%.

The above light-shielding unit M2 may correspond to a boundary between the first region A and the second region B of the semiconductor substrate 100. The non-exposure region 112a is formed in the boundary between the first region A and the second region B of the semiconductor substrate 100. The non-exposure region 112a is not removed in a subsequent development process and defined as a second photoresist pattern 112a. The second photoresist pattern 112a remains in the boundary between the first region A and the second region B of the semiconductor substrate 100 in a subsequent etch process, thereby preventing the third auxiliary pattern 110c, formed in the boundary between the first region A and the second region B of the semiconductor substrate 100, from being excessively etched and removed.

Furthermore, the first transmission unit M1 may correspond to the first region A. Thus, each of the third auxiliary patterns 110c is formed between the first photoresist patterns 108a in the first region A of the semiconductor substrate 100.

The second exposure unit M3 may correspond to the second region B of the semiconductor substrate 100. That is, the amount of light exposure may be a maximum in the second region B of the semiconductor substrate 100. Thus, H+ ions of the second exposure region 112c formed in the second region B of the semiconductor substrate 100 can be diffused into the entire region of the auxiliary layer 110 (refer to FIG. 1E) formed in the second region B of the semiconductor substrate 100.

Meanwhile, the first transmission unit M1 may correspond to part of the second region B, adjacent to the first region A. Accordingly, the height of the third auxiliary patterns 110c on both sides of the second photoresist pattern 112a can become identical.

Figure 1G:
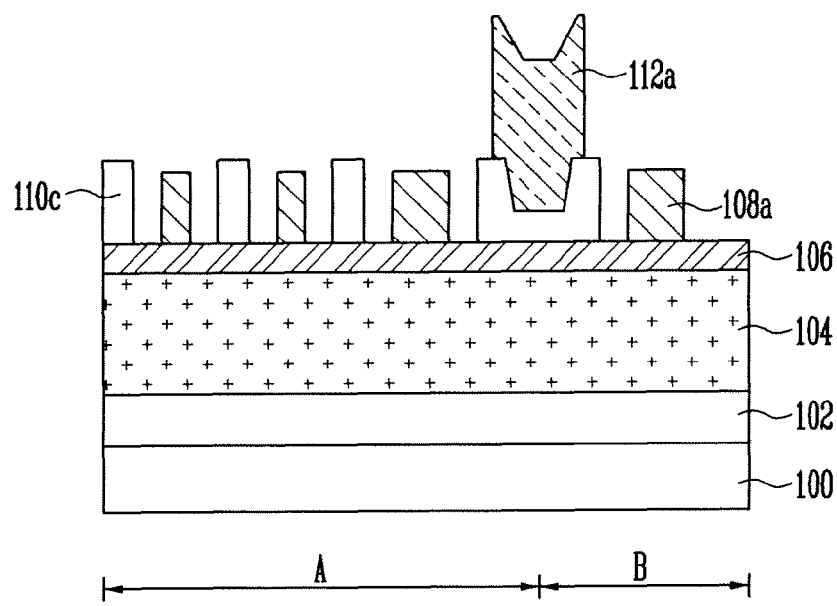

Referring to FIG. 1G, the first and second exposure regions including $H^+$ ions are removed by performing a typical development process for the photoresist film. At this time, the first and second auxiliary patterns are also removed.

Accordingly, etch mask patterns, including the third auxiliary patterns 110c and the first photoresist patterns 108a, are formed on the first region A of the semiconductor substrate 100. Here, the first photoresist patterns 108a are formed to have a minimum pitch and each have a minimum width which can be implemented through exposure and development processes. Accordingly, the etch mask patterns having a more dense pitch (i.e., a half pitch) than the minimum pitch which can be implemented through exposure and development processes can be formed in the first region A of the semiconductor substrate 100 because of the existence of the third auxiliary patterns 110c each formed between the first photoresist patterns 108a.

Furthermore, only the first photoresist pattern 108a remains on the second region B of the semiconductor substrate 100. Thus, the first photoresist pattern 108a formed in the second region B of the semiconductor substrate 100 can be used as the etch mask patterns because the first photoresist patterns 108a are formed to have a similar pitch and each have a similar width as that of target patterns in the above process.

Furthermore, the second photoresist pattern 112a remains between the first region A and the second region B of the semiconductor substrate 100, and so the underlying third auxiliary patterns 110c can remain without being removed. Since a pattern has to be formed between the first region A and the second region B of the semiconductor substrate 100, an etch mask pattern has to be formed between the first region A and the second region B of the semiconductor substrate 100. However, the thickness of the third auxiliary patterns 110c is thin because of the difference in the gap between the patterns formed in the first region A and the second region B of the semiconductor substrate 100. Accordingly, if the etch mask patterns are formed of only the third auxiliary patterns 110c, the patterns are unstable and, therefore, can be removed through development and etch processes. In the embodiment of this disclosure, the second photoresist pattern 112a is formed on the third auxiliary pattern 110c between the first region A and the second region B of the semiconductor substrate 100. Thus, a more stable etch mask pattern can be formed during development and etch processes.

Figure 1H:
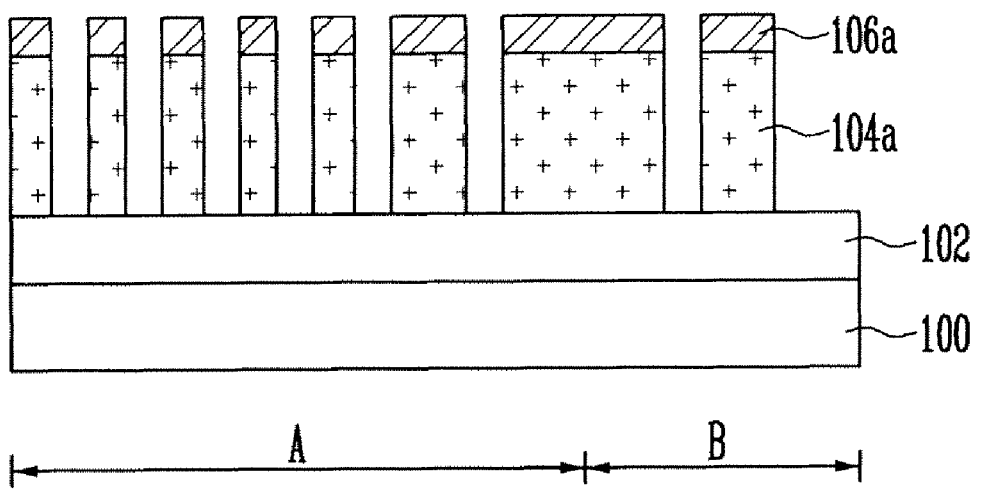

Referring to FIG. 1H, an etch process is performed for the anti-reflective layer 106 and the hard mask layer 104 using the first photoresist pattern 108a, the third auxiliary patterns 110c, and the second photoresist pattern 112a, thereby forming BARC film patterns 106a and hard mask patterns 104a.

Figure 1I:
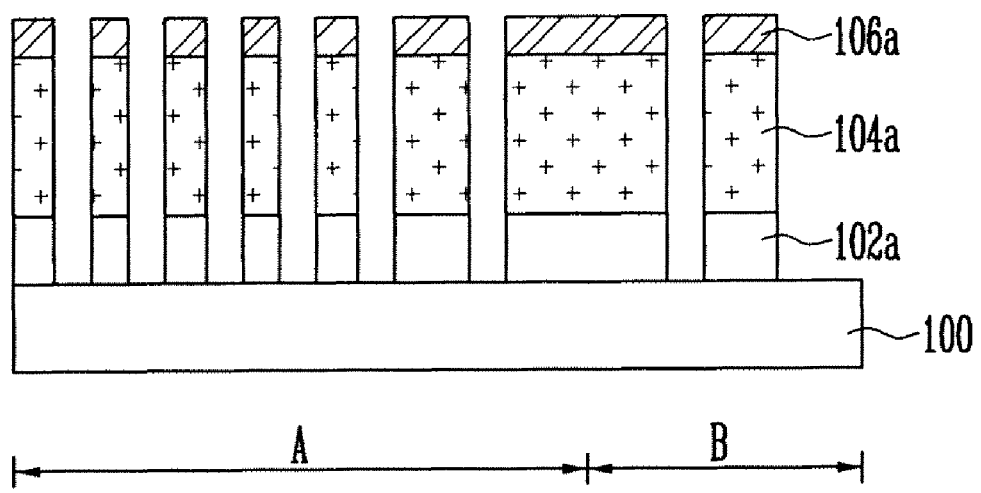

Referring to FIG. 1i, the target etch layer 102 is patterned using an etch process using the BARC film patterns 106a and the hard mask patterns 104a, thereby forming target etch layer patterns 102a.

The foregoing description is given for clearness of understanding only, and no unnecessary limitations should be understood therefrom, as modifications within the scope of the invention may be apparent to those having ordinary skill in the art.

What is claimed is:

1. A method of forming patterns of a semiconductor device, the method comprising:
   providing a semiconductor substrate defining etch auxiliary patterns formed over a target etch layer;
   forming an auxiliary layer over the semiconductor substrate and the etch auxiliary patterns;
   forming first auxiliary patterns within first parts of the auxiliary layer coming into contact with the etch auxiliary patterns by denaturing the first parts of the auxiliary layer;
   forming a second auxiliary pattern within a second part of the auxiliary layer coming into contact with the etch auxiliary patterns by denaturing the second part of the auxiliary layer, wherein the second auxiliary pattern comes into contact with top surfaces of the first auxiliary patterns so that the non-denatured auxiliary layer remains between the etch auxiliary patterns; and,
   removing the first and second auxiliary patterns to form etch mask patterns comprising the etch auxiliary patterns and the non-denatured auxiliary layer.

2. The method of claim 1, wherein forming of the second auxiliary pattern comprises:
   forming a material film over the auxiliary layer, wherein The material film is the same as the etch auxiliary patterns; and,
   denaturing the second part of the auxiliary layer that contacts the material film.

3. The method of claim 2, wherein the first and second auxiliary patterns are formed in such a manner that hydrogen ions (H+) are diffused from the etch auxiliary patterns or the material film.

4. The method of claim 2, wherein the first and second auxiliary patterns are removed simultaneously with the material film.

5. The method of claim 2, wherein the material film is formed of a photoresist film.

6. The method of claim 5, wherein the first and second auxiliary patterns are removed simultaneously in a development process for the photoresist film.

7. The method of claim 5, wherein the second auxiliary pattern is formed by performing an exposure process on the photoresist film.

8. The method of claim 1, wherein:
   the etch auxiliary patterns comprise fat-soluble materials, and
   the auxiliary layer comprises water-soluble materials.

9. The method of claim 8, further comprising, after forming the auxiliary layer, performing a baking process at a temperature higher than a glass transition temperature of the etch auxiliary patterns and the auxiliary layer.

10. The method of claim 1, wherein the first auxiliary patterns are formed by an annealing process.

11. The method of claim 1, wherein a gap between the etch auxiliary patterns is three times greater than a width of each of the etch auxiliary patterns.

12. The method of claim 1, wherein a thickness of the first auxiliary pattern is identical to that of etch auxiliary pattern.

13. A method of forming patterns of a semiconductor device, the method comprising:
   forming a target etch layer and etch auxiliary patterns over a semiconductor substrate defining first and second regions, the etch auxiliary patterns having a pitch or each has a width greater in the second region than in the first region;
   forming an auxiliary layer over the semiconductor substrate and the etch auxiliary patterns;

forming first auxiliary patterns within first parts of the auxiliary layer coming into contact with the etch auxiliary patterns by denaturing the first parts of the auxiliary layer;

forming a second auxiliary pattern within a second part of the auxiliary layer coming into contact with the first auxiliary patterns by denaturing the second part of a the auxiliary layer, wherein the second auxiliary pattern comes into contact with top surface of the first auxiliary patterns so that the non-denatured auxiliary layer remains between the etch auxiliary patterns; and, removing the first and second auxiliary patterns to form etch mask patterns comprising the etch auxiliary patterns and the non-denatured auxiliary layer.

14. The method of claim 13, wherein the forming of the second auxiliary pattern comprises:

forming a material film over the auxiliary layer, wherein the material film is the same as the etch auxiliary patterns;

performing an exposure process using a reticle that includes a first transmission unit, a second transmission unit and a light shielding unit so that the material film is divided into a non-exposure region corresponding to the light shielding unit, a first exposure region corresponding to the first transmission unit and a second exposure region corresponding to the second transmission unit; and, denaturing the second part of the auxiliary layer that contacts the first and second exposure regions of the material film.

15. The method of claim 14, wherein the first and second auxiliary patterns are formed in such a manner that hydrogen ions (H$^+$) are diffused from the etch auxiliary patterns or the first and second exposure regions of the material film.

16. The method of claim 14, wherein the material film is formed of a photoresist film.

17. The method of claim 16, wherein the first and second auxiliary patterns are removed simultaneously in a development process for the photoresist film.

18. The method of claim 14, wherein the non-exposure region is formed in a boundary between the first and second regions, the first exposure region is formed in the first region and a second exposure region is formed in the second region.

19. The method of claim 18, wherein the second auxiliary pattern is formed in an entire region other than a boundary between the first and second regions.

20. The method of claim 18, wherein transmittances of the first and second transmission units are set differently.

21. The method of claim 18, wherein the first transmission unit transmits light less than the second transmission unit so that an amount of hydrogen ions (H+) generated within the second exposure region is greater than an amount generated within the first exposure region.

22. The method of claim 14, wherein the height of the non-denatured auxiliary layer in the first region diminishes with an increasing transmittance of light in the first transmission unit.

23. The method of claim 14, wherein the first and second exposure regions are removed simultaneously with the first and second auxiliary patterns.

24. The method of claim 14, wherein removing the first and second auxiliary patterns is performed to remain the non-exposure region of the material layer.

25. The method of claim 13, wherein:

the etch auxiliary patterns comprise fat-soluble materials, and the auxiliary layer comprises water-soluble materials.

26. The method of claim 25, further comprising, after forming the auxiliary layer, performing a baking process at a temperature higher than a glass transition temperature of the etch auxiliary patterns and the auxiliary layer.

27. The method of claim 13, wherein the auxiliary layer is formed to fully fill spaces between the etch auxiliary patterns in the first region and along a surface of the etch auxiliary patterns in the second region.

28. The method of claim 13, wherein the first auxiliary patterns are formed by an annealing process.

29. The method of claim 13, wherein a gap between the etch auxiliary patterns formed in the first region is three times greater than a width of each of the etch auxiliary patterns formed in the first region.

30. The method of claim 13, wherein a thickness of the first auxiliary pattern is identical to that of the etch auxiliary pattern formed in the first region.

* * * * *